United States Patent [19]

Liu

[11] Patent Number: 5,850,099
[45] Date of Patent: Dec. 15, 1998

[54] THERMALLY UNIFORM TRANSISTOR

[75] Inventor: William Uei-Chung Liu, Dallas, Tex.

[73] Assignee: Texas Instruments Incorporated, Dallas, Tex.

[21] Appl. No.: 150,742

[22] Filed: Nov. 12, 1993

Related U.S. Application Data

[63] Continuation of Ser. No. 891,315, May 29, 1992, abandoned.

[51] Int. Cl.$^6$ .......................... H01L 29/41; H01L 29/812; H01L 29/80
[52] U.S. Cl. .......................... 257/469; 257/287; 257/280; 257/579; 257/583; 257/563
[58] Field of Search .................................. 257/469, 579, 257/580, 582, 583, 563, 564, 287, 241, 270, 280, 365

[56] References Cited

U.S. PATENT DOCUMENTS

| | | | |
|---|---|---|---|
| 3,309,585 | 3/1967 | Forrest | 257/582 |
| 3,704,398 | 11/1972 | Fukino | 257/469 |
| 4,939,562 | 7/1990 | Alderstein | 257/198 |
| 5,057,882 | 10/1991 | Pritchett . | |

OTHER PUBLICATIONS

Guang-bo Gao, et al., "Thermal Design Studies of High-Power Heterojunction Bipolar Transistors", *IEEE Transactions on Electron Devices,* 36(5), pp. 854–863, May 1989.

Guang-bo Gao, et al., "Uniform junction temperature AlGaAs/GaAs power heterojunction bipolar transistors on silicon substrates", *Applied Physics Letters,* 58(10), pp. 1068–1070, Mar. 11, 1991.

*Primary Examiner*—Jerome Jackson
*Attorney, Agent, or Firm*—Michael K. Skrehot; William B. Kempler; Richard L. Donaldson

[57] ABSTRACT

Generally, and in one form of the invention, a method for fabricating a transistor having a plurality of active regions comprising spacing or shaping the emitters 20 and 22, or gates, in a non-uniform manner to provide a substantially constant temperature over an active region of the transistor is disclosed. An advantage of the invention is that the occurrence of a thermal runaway condition between transistor current and temperature is generally avoided.

9 Claims, 10 Drawing Sheets

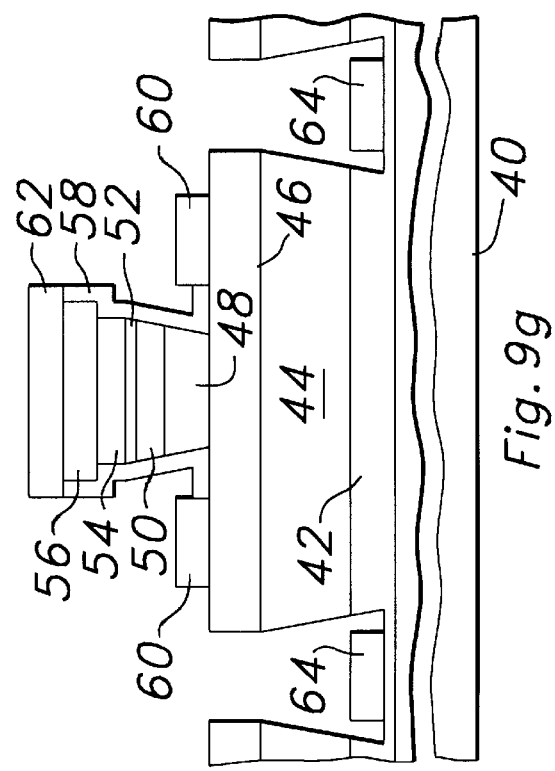
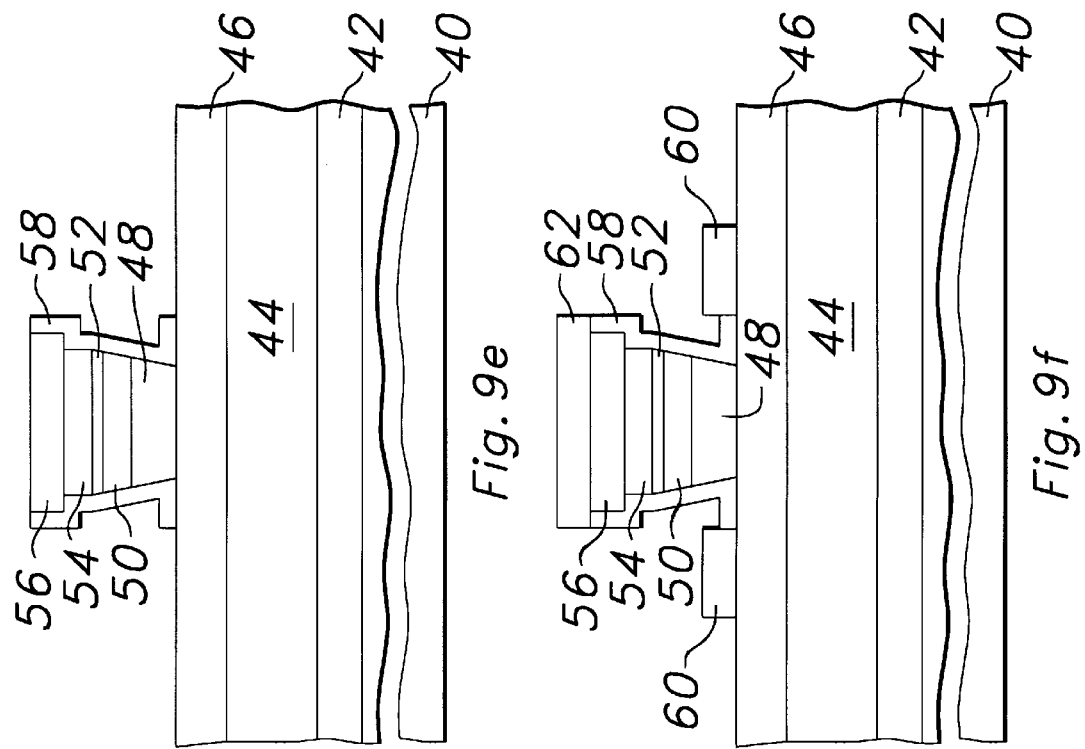

THERMALLY UNIFORM TRANSISTOR

This application is a Continuation of application Ser. No. 07/891,315, filed May 29, 1992 now abandoned.

(C) Copyright, *M* Texas Instruments Incorporated 1992. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to thermally uniform transistors.

BACKGROUND OF THE INVENTION

Without limiting the scope of the invention, its background is described in connection with heterojunction bipolar transistors (HBTs), as an example.

Heretofore, in this field, heterojunction bipolar transistors have suffered from performance degradation and catastrophic failure when operated under high power conditions. The cause of these problems has generally been attributed to that of a condition of positive feedback between transistor current and temperature. High power HBTs typically have multiple emitter fingers so that the transistor can handle higher currents. Each emitter finger has associated base and collector electrodes, so the multi-finger transistor may be viewed to consist of several active regions, or discrete transistors, connected in parallel. The problem of positive feedback occurs when localized heating occurs on one of the emitter fingers, forming a "hot spot". As the junction temperature rises in the vicinity of the hot spot, the collector current increases in the finger. The larger current causes the junction temperature to rise further, thereby inducing more current to flow. Eventually, the total current in the multi-finger transistor attempts to flow through the single hot finger, thus leading to thermal runaway and a catastrophic failure. Past solutions to this problem have relied on a resistor in series with each emitter finger. Therefore, as the current through the finger increases with rising junction temperature, the same increased current flow through the emitter, or "ballast", resistor causes an increased amount of voltage to be dropped across the resistor. Since the applied external bias voltage is fixed, the available voltage to be dropped across the base-emitter junction decreases, thus limiting the emitter-collector current through the emitter finger.

SUMMARY OF THE INVENTION

Past solutions to the problem of "hot spotting" in heterojunction bipolar transistors have centered around techniques which distribute ballast resistance between the emitters of the discrete transistors that combine in parallel to make a multi-finger high power transistor. However, it is herein recognized that other solutions exist to the problem. It is believed that a transistor structure design in which the temperature from discrete transistor to discrete transistor, or more specifically, emitter finger to emitter finger, varies is undesirable. Past HBTs have had emitter structures that consisted of uniformly spaced identical emitter fingers. It has now been realized that finger to finger temperature variation is inevitable because the outermost fingers of the device are able to dissipate heat much more readily than are the inner fingers. That is, heat dissipation from the outer fingers has less thermal resistance than the inner fingers. Consequently, the conditions for "hot spotting" occur much more frequently in the inner fingers than in the outer. This is an undesirable condition that the present invention overcomes.

Generally, and in one form of the invention, a method for fabricating a transistor having a plurality of active regions comprising spacing or shaping the active regions in a non-uniform manner to provide a substantially constant temperature over an active region of the transistor is disclosed. An advantage of the invention is that the occurrence of a thermal runaway condition between transistor current and temperature is generally avoided.

Thus, while prior art approaches tried to equalize current in the fingers of a transistor, herein the temperature is made more equal, in some cases by making the currents unequal.

BRIEF DESCRIPTION OF THE DRAWINGS

In the drawings:

FIG. 1b is a cross-sectional view of FIG. 1a;

FIG. 3b is a cross-sectional view of FIG. 3a;

FIG. 5b is a cross-sectional view of FIG. 5a;

FIG. 7b is a cross-sectional view of FIG. 7a;

FIG. 9a–9g are cross-sectional views of an emitter finger at various stages of processing.

Corresponding numerals and symbols in the different figures refer to corresponding parts unless otherwise indicated.

DETAILED DESCRIPTION OF PREFERRED EMBODIMENTS

Figure 1A:
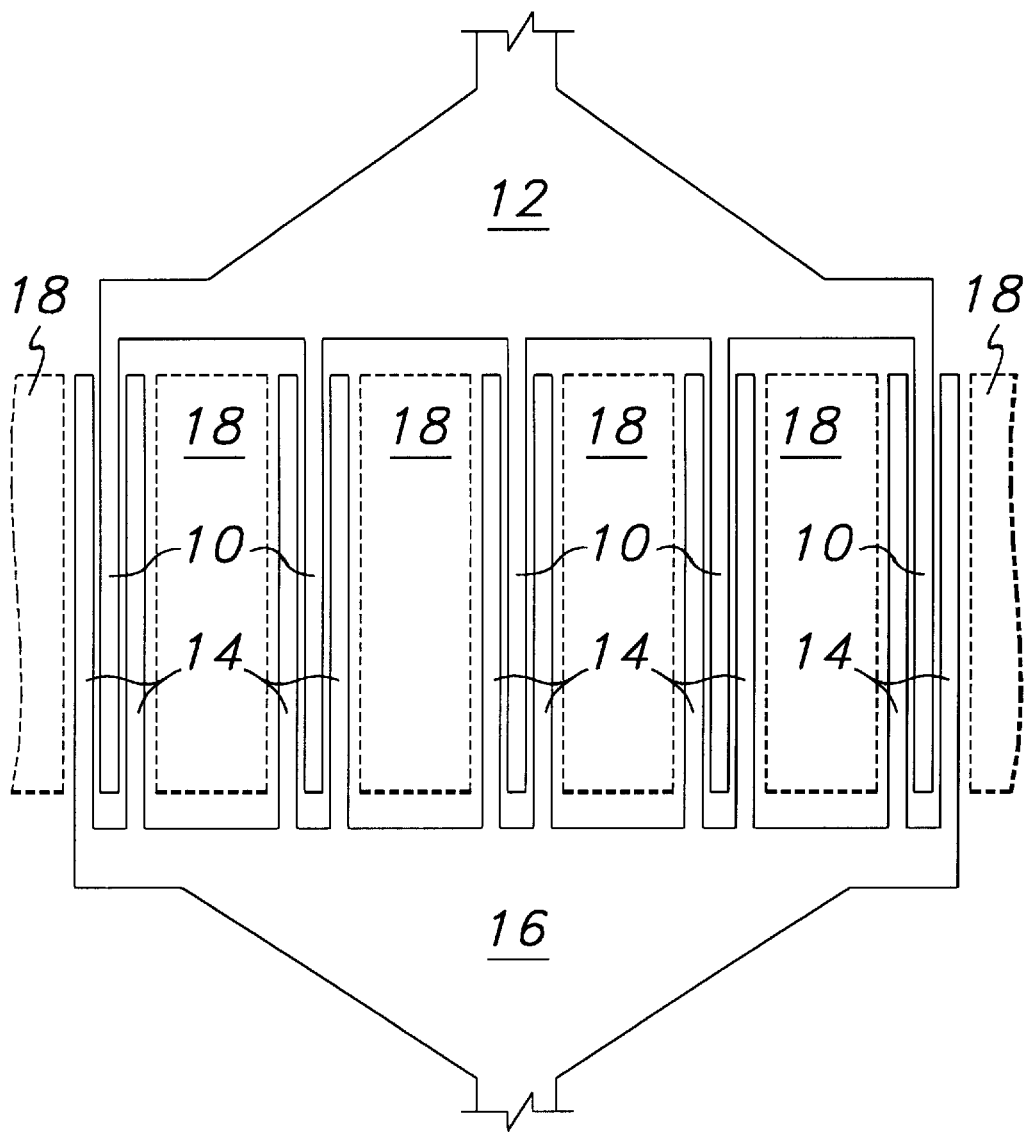
FIG. 1a is a plan view of a typical prior art emitter and base feed structure for a bipolar transistor.
Figure 1B:
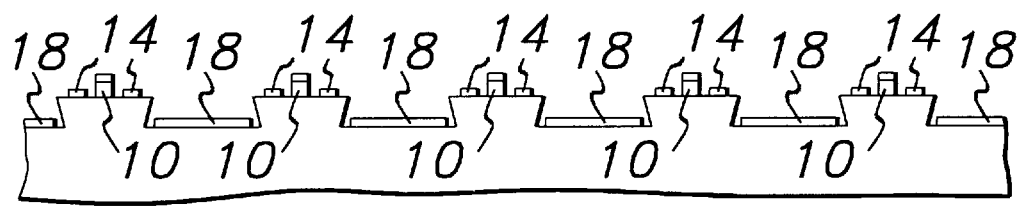
Figure 2:
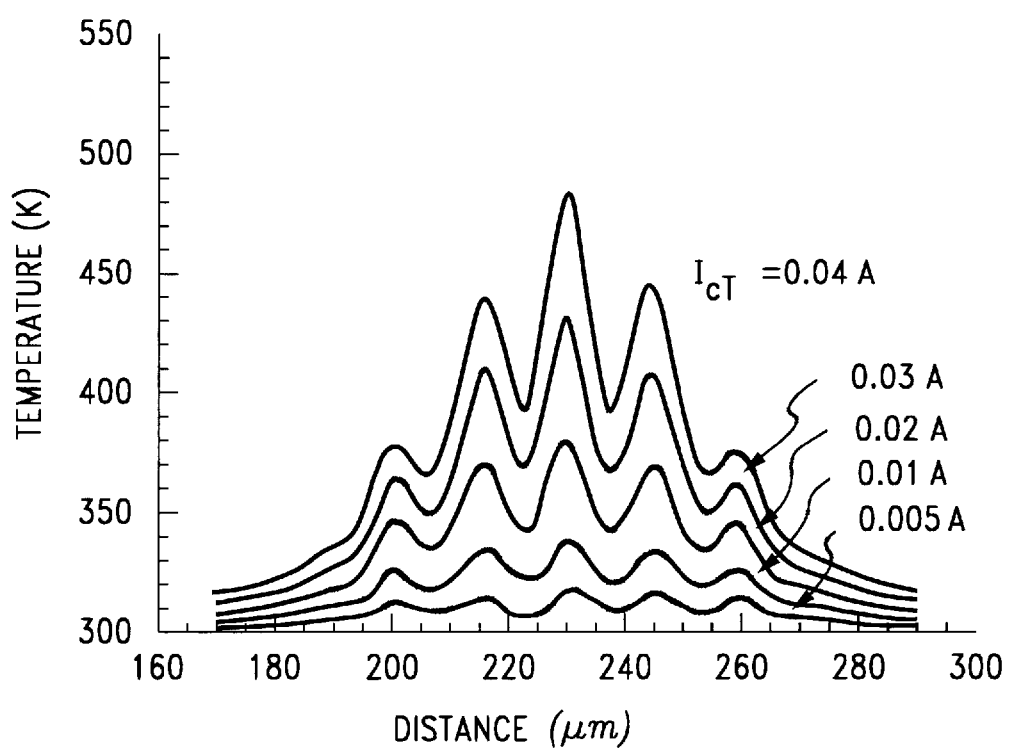
FIG. 2 is a temperature profile of a typical prior art bipolar transistor.

High power amplifiers often employ multi-finger structures to increase the total power output. In bipolar devices such as Si bipolar transistors or heterojunction bipolar transistors, these fingers are generally in the emitter structure. In field effect transistors such as Si MOSFET and GaAs MESFET or GaAs MODFET, these fingers are generally in the gate structure. The following embodiments of the inventive concept are described in relation to application to bipolar transistors. It should be noted that the inventive concepts described herein can be equally effectively applied to field effect devices, although it should further be noted that the tapering of the width of the emitter structure discussed in the description of the second preferred embodiment could be reversed for the gate structure of a field effect transistor. A bipolar transistor's emitter fingers typically are laid out as shown in the prior art structure of FIG. 1a and 1b, with each finger designed to deliver a certain amount of current. In FIG. 1a the emitter fingers 10 are connected to a common emitter feed structure 12 which leads to circuitry that comprises the amplifier of which the transistor is a part. Similarly, base fingers 14 run along either side of each emitter finger 10 and connected to a common base feed structure 16. Collector contacts 18, shown as dotted lines are typically connected to one another by airbridges (not shown) that span the base and emitter fingers. The mesa cross-sections of the emitter and base regions are shown in FIG. 1b. The entire device can be considered to consist of many sub-devices connected together. During transistor operation, power is dissipated as heat energy near the fingers 10, causing the temperature at each finger to rise. A typical temperature profile for a five-finger device having fingers located at 200 μm, 215 μm, 230 μm, 245 μm and 260 μm away from the edge of the wafer is shown in FIG. 2. The temperature profile is plotted as a function of total device current. As shown in FIG. 2, the temperature is hottest for the center finger and coolest for the outermost fingers, especially when the device current is large. Such a temperature profile in which the temperature varies from finger to finger is undesirable. When a finger reaches a temperature high enough such that a heat-related failure mechanism (such as current hogging) occurs in that particular finger, the entire transistor fails. Therefore, a more desirable temperature profile is one in which the temperature is fairly constant for all the fingers.

Figure 3A:
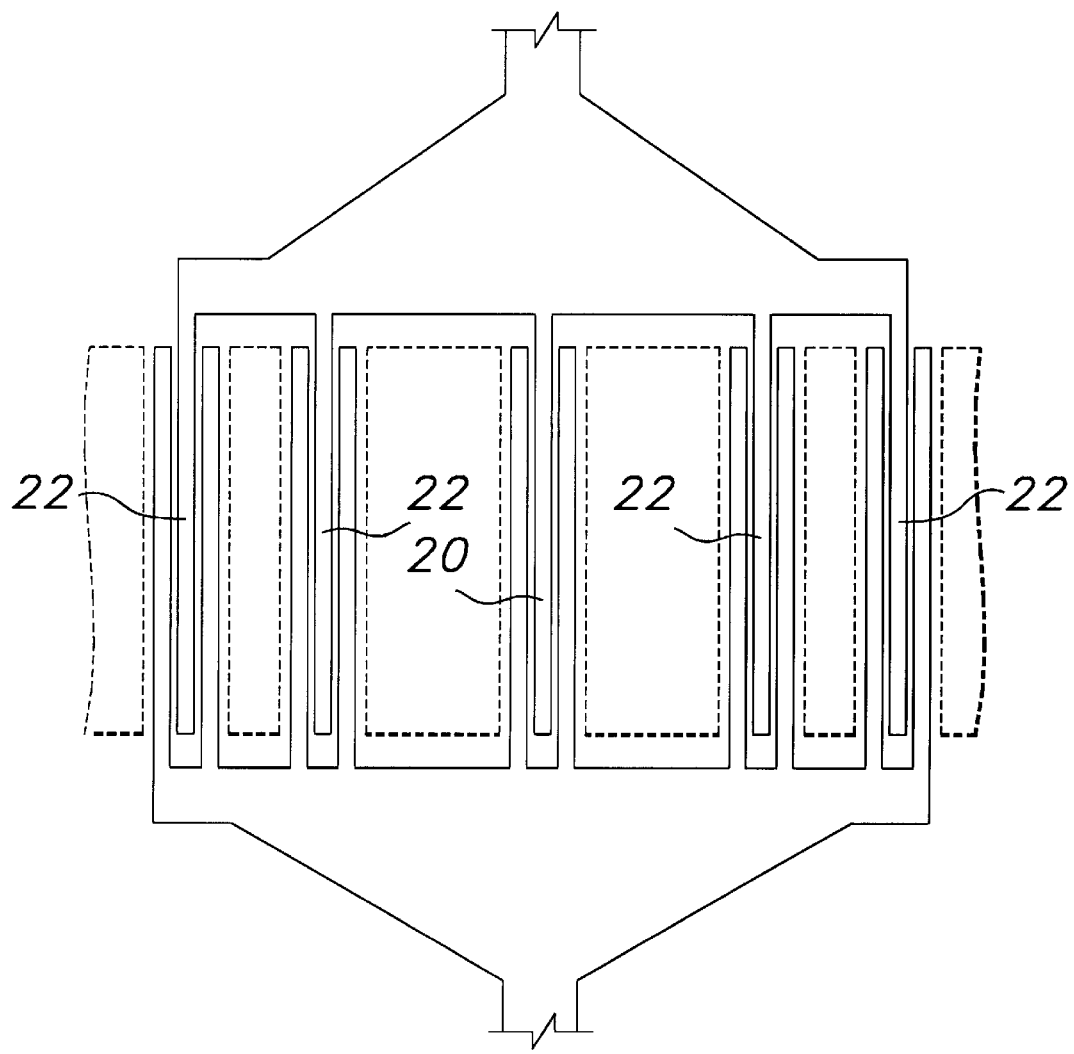
FIG. 3a is a plan view of the first preferred embodiment emitter and base feed structure.
Figure 3B:
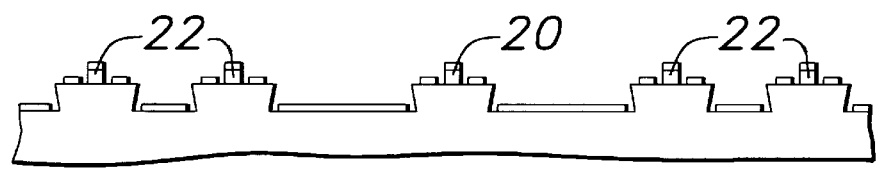
Figure 4:
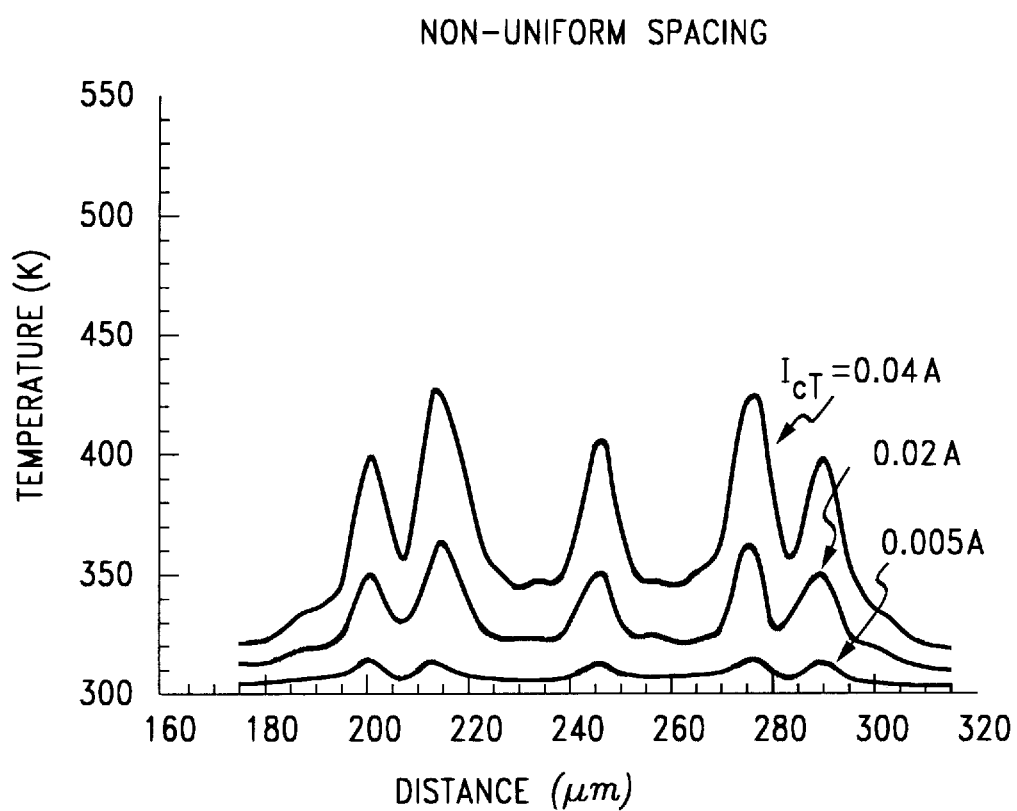
FIG. 4 is a temperature profile of the first preferred embodiment structure.

Referring again to FIG. 2, it is evident that the outer fingers naturally have the lowest temperatures because the heat produced in the outer fingers is readily removed through the relatively vast area outside of the device. In contrast, the central finger is sandwiched between fingers and its heat cannot be as well dissipated as in the outer fingers. In other words, the outer fingers have lower thermal resistance than does the central finger. Hence, for a given power dissipation, the temperature of the outer fingers is lower than that of the central finger. The first preferred embodiment emitter structure shown in FIG. 3a and 3b, however, has non-uniform spacing, with the spacing between two fingers largest in the center and smallest toward the edge. Since the center finger 20 will naturally be hotter, the wider heat dissipation area around the center finger helps to dissipate the heat more efficiently, thus lowering the central finger temperature. The spacing is moved closer for the outer fingers 22 because they naturally have lower temperatures and do not need a wider area to dissipate heat. Therefore, the overall temperature profile is more uniform, with no particular finger hotter than the others, as shown in the plot of FIG. 4. In FIG. 4 is shown a temperature distribution of a transistor comprising several sets of fingers arranged about a central finger. The central finger is located at a position corresponding to 245 μm in FIG. 4, while the nearest set of fingers to the central finger are located 30 μm away at 215 μm and 275 μm, respectively. The next-nearest set of fingers is located 45 μm from the central finger at 200 μm and 290 μm, respectively. In other words, an arrangement in which the spacing between the central finger and the nearest set of fingers is approximately 50% larger than the spacing between the nearest set of fingers and the next-nearest set of fingers produced the uniform temperature profile of FIG. 4.

Figure 5A:
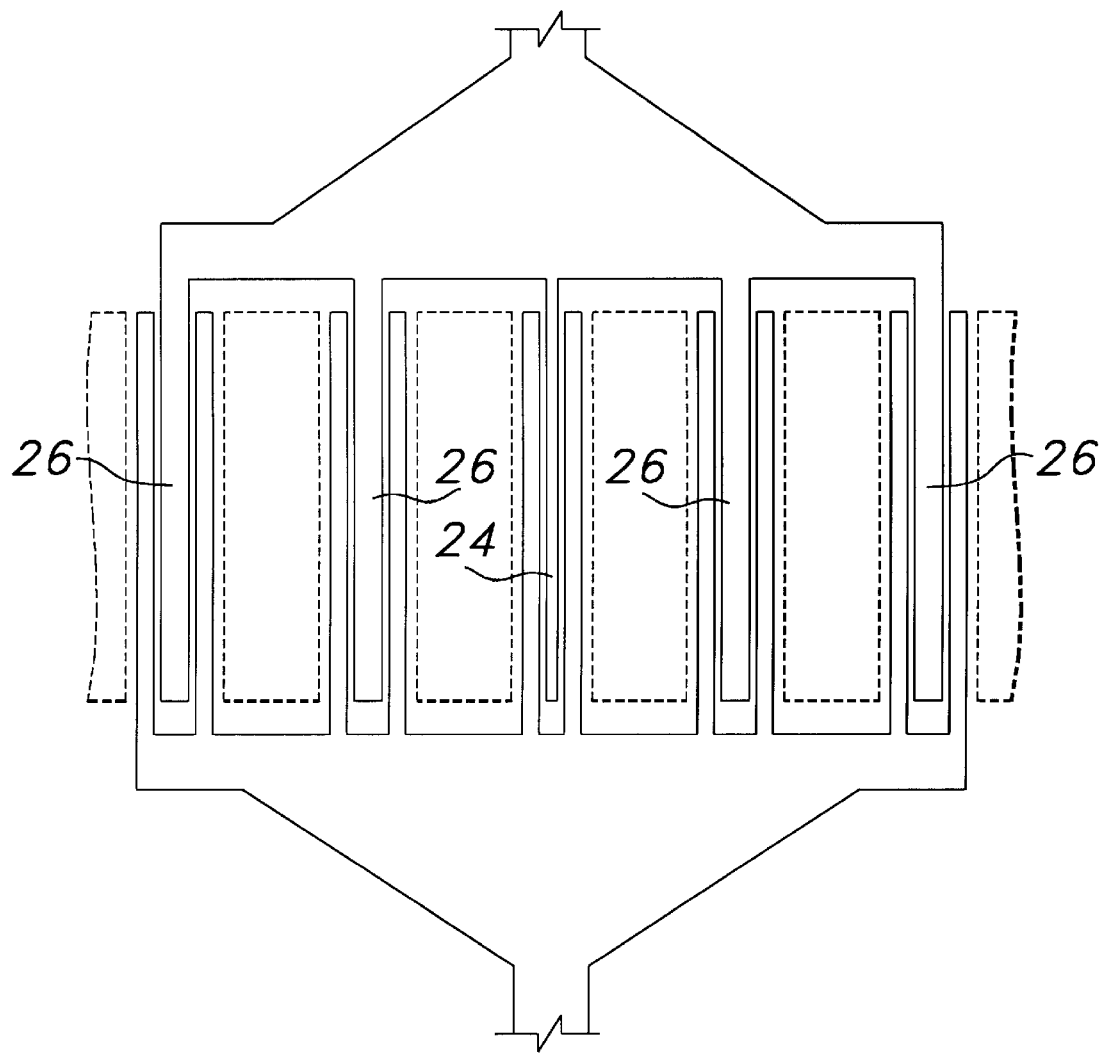
FIG. 5a is a plan view of the second preferred embodiment emitter and base feed structure.
Figure 5B:
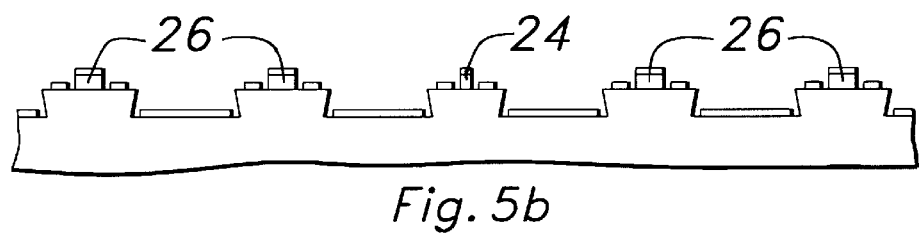

An alternative method would be to reduce the power input for the center finger. That is, if there is less power dissipated in the center finger than in the other fingers, even though it has higher thermal resistance, the temperature would not rise above that of the other fingers. The second preferred embodiment emitter structure of FIG. 5a and 5b illustrates such a concept. For bipolar devices, the emitter current flows directly through the emitter fingers. Therefore a narrower width finger, as shown in the center finger 24 of FIG. 5a and 5b, having a higher impedance than the wider outer fingers, would limit emitter current more than would the wide outer fingers 26. It should be noted that finger spacing is kept uniform in this embodiment. The tapering of the current, and therefore the heat dissipation is accomplished by the tapering of the emitter finger widths.

Figure 6:
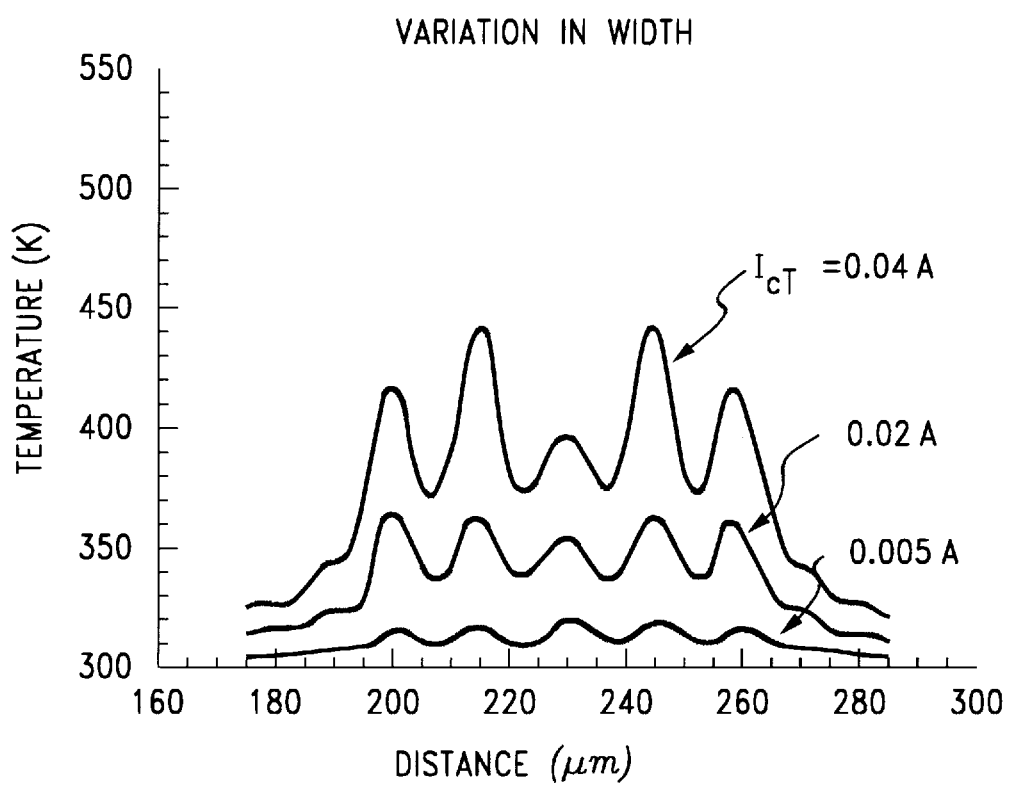
FIG. 6 is a temperature profile of the second preferred embodiment structure.

The second preferred embodiment structure differs from the first in that it seeks to modify the power dissipated from each finger in order to keep the temperature of the entire structure uniform; whereas the fingers in the first embodiment dissipate power equally, but are non-uniformly spaced to account for differences in heat sinking available to each finger. A temperature profile for the second preferred embodiment is shown in FIG. 6.

Figure 7A:
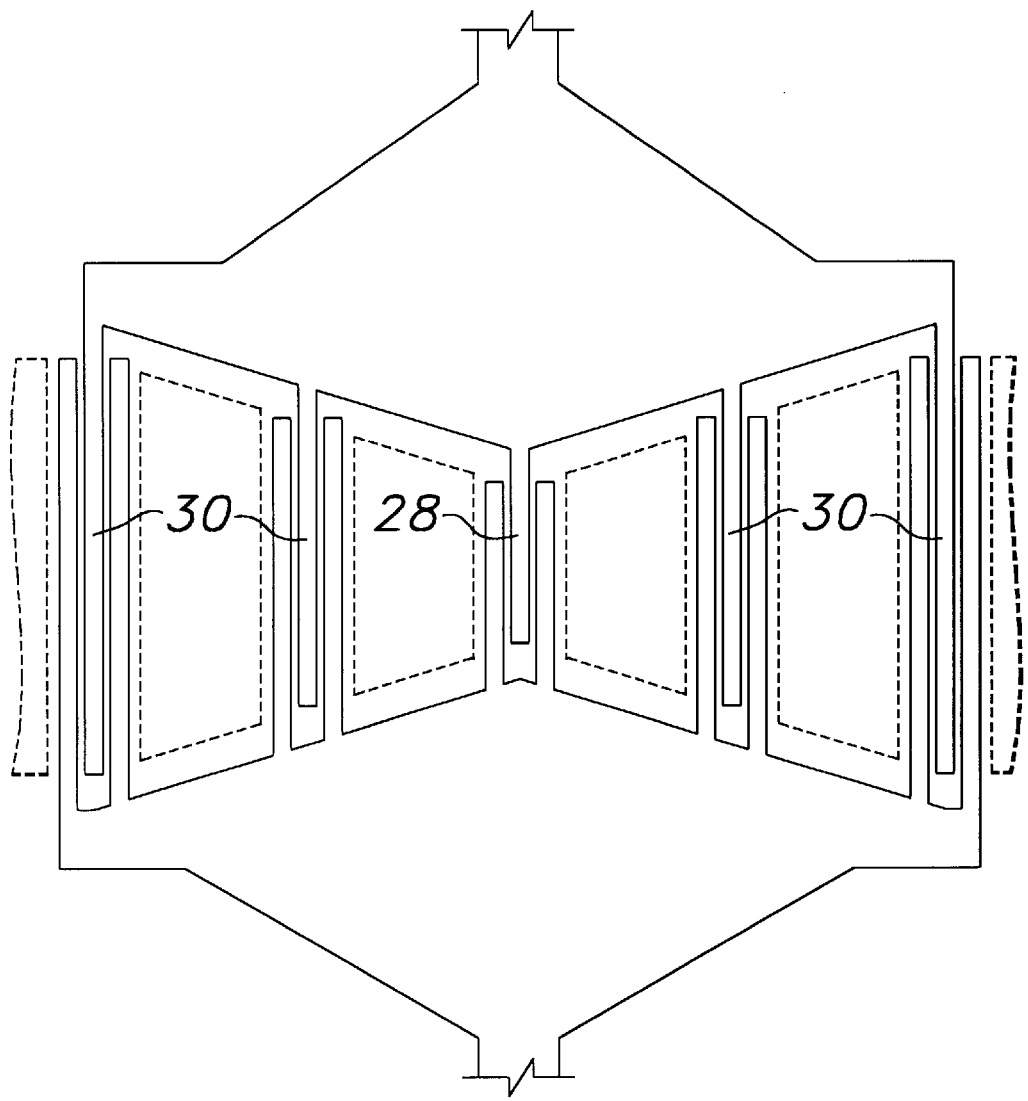
FIG. 7a is a plan view of the third preferred embodiment emitter and base feed structure.
Figure 7B:
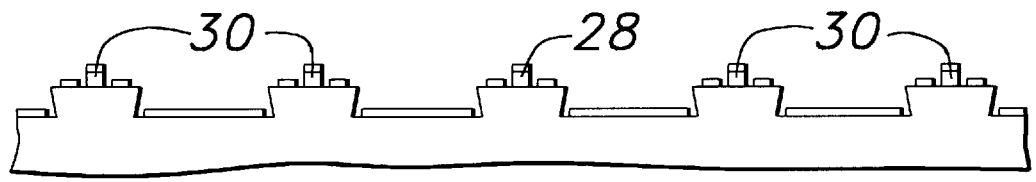
Figure 8:
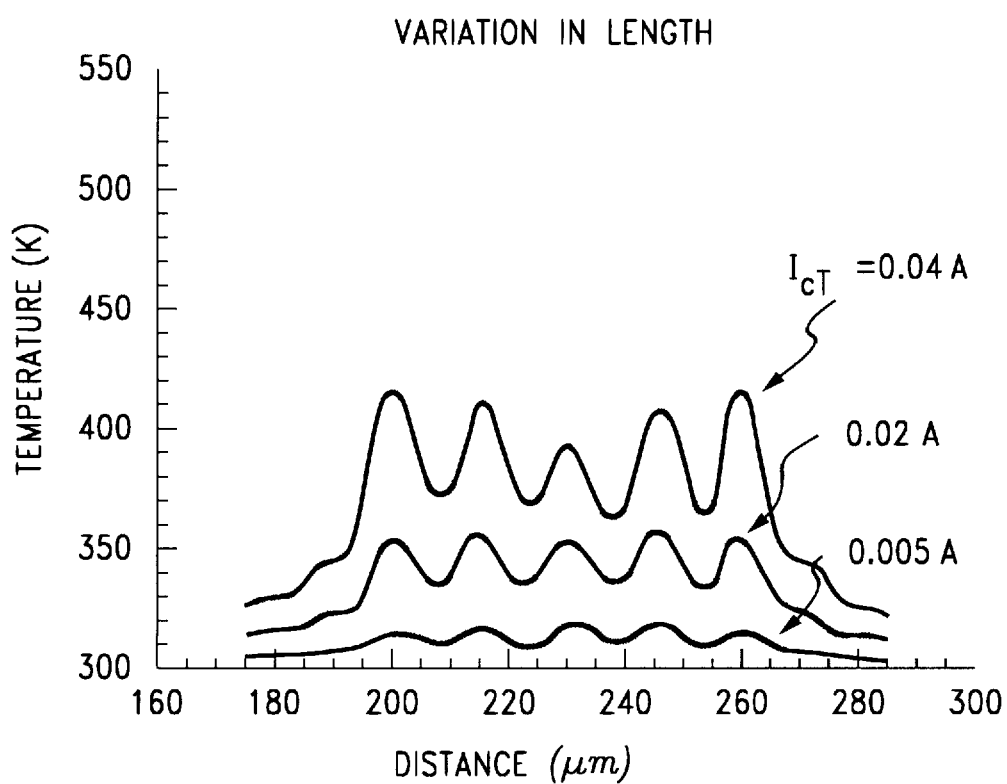
FIG. 8 is a temperature profile of the third preferred embodiment structure.

With the consideration of reducing the power dissipation in the center finger, another finger layout, the third preferred embodiment shown in FIG. 7a and 7b can be utilized. Such an approach calls for shorter finger length in the middle 28 and longer length in the outer fingers 30. A shorter emitter or gate length in the middle finger 28 draws less current, and therefore the device dissipates less power in the middle and more in the outer fingers. The finger lengths are tapered from inner to outer to maintain a relatively uniform temperature profile across the fingers in the emitter structure.

With reference to FIGS. 9a–9g, a method for fabricating the preferred embodiments of the present invention is described hereinbelow.

Figure 9C:
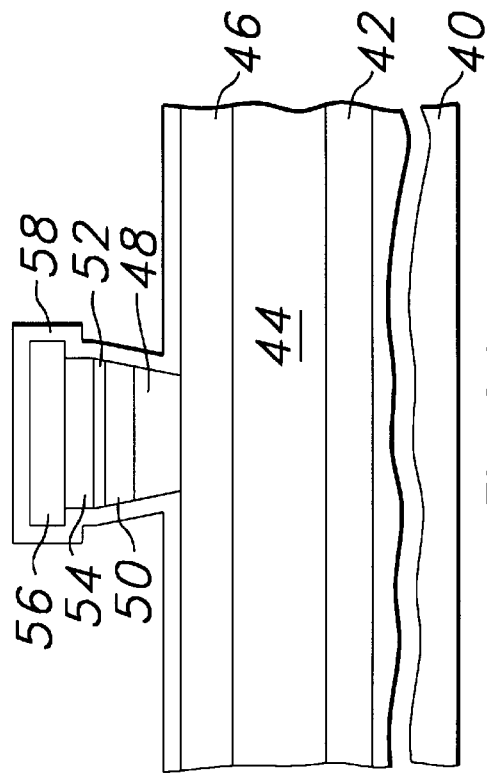
Figure 9D:
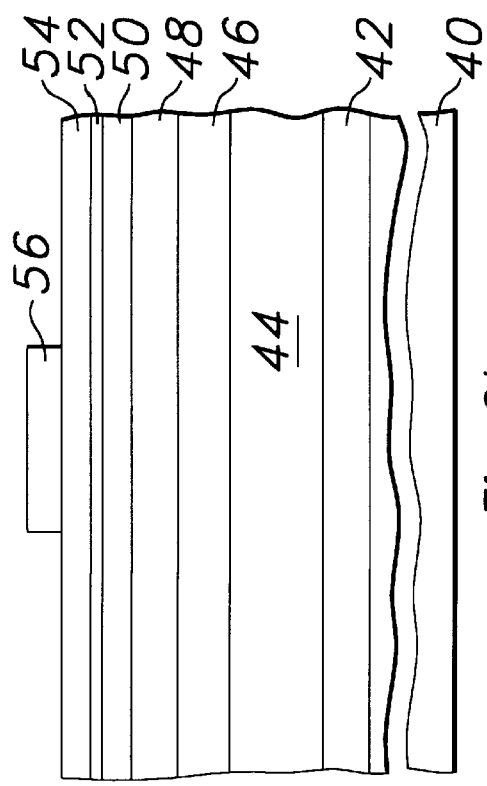
Figure 9A:
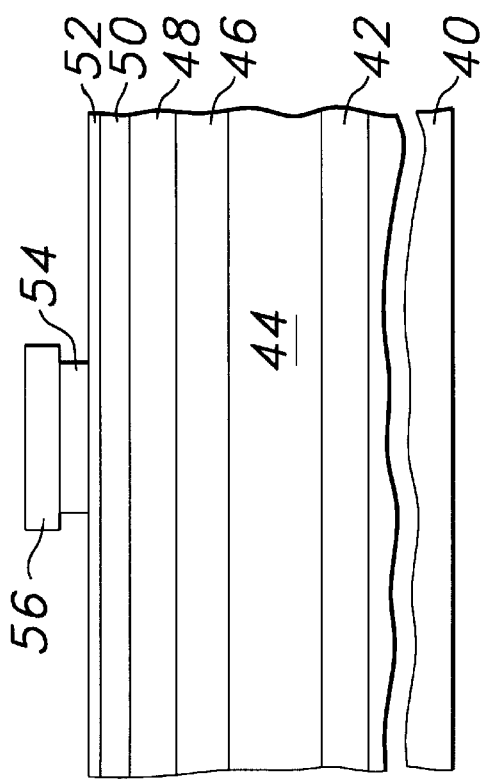
Figure 9B:
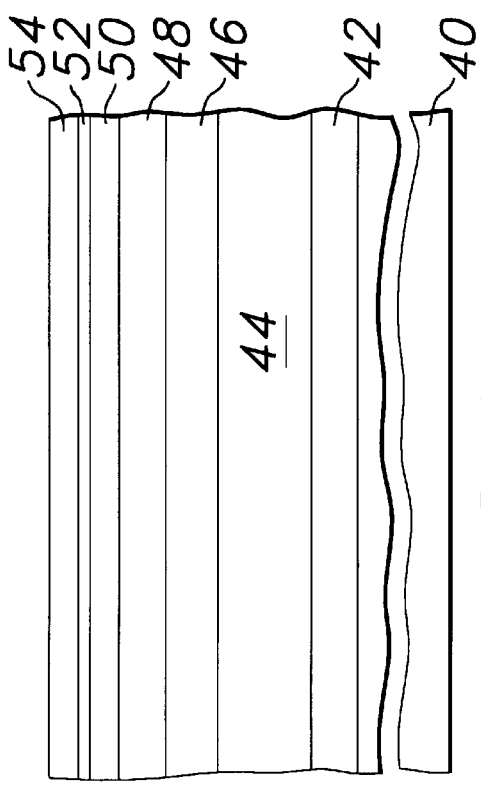

(a) A substrate material for this process is shown in FIG. 9a; note that the vertical is exaggerated in the drawings for clarity. It is composed of a semi-insulating semiconductor material 40 (such as GaAs).

(b) A subcollector layer 42 of n-type GaAs, for example, is epitaxially grown on the substrate 40 by a suitable process (such as Molecular Beam Epitaxy (MBE) or Metal Organic Chemical Vapor Deposition (MOCVD)) to a thickness of 1 μm and doped with Si to a concentration of approximately $5 \times 10^{18}$ cm$^{-3}$.

(c) A collector layer 44 is epitaxially grown on subcollector layer 42 to a thickness of 1 μm, doped at approximately $1 \times 10^{16}$ cm$^{-3}$ and is preferably made of GaAs.

(d) A base epilayer 46 of GaAs, for example, is deposited onto collector layer 44 to a thickness of 0.08 μm and doped with C, for example, to a concentration of approximately $\geq 3 \times 10^{19}$ cm$^{-3}$.

(e) Emitter layer 48 of n-type $Al_xGa_{1-x}As$, where x=0.3, is then deposited onto base layer 46 at a thickness of 0.2 μm by epitaxy.

(f) GaAs buffer layer 50 of n-type GaAs doped to a concentration of approximately $5 \times 10^{18}$ cm$^{-3}$ of thickness of approximately 100 Angstroms is grown on emitter layer 48.

(g) An InGaAs top emitter contact layer 52 doped to a concentration of approximately $>1 \times 10^{19}$ cm$^{-3}$ is then grown on buffer layer 50.

(h) A WSi layer 54 is then sputter deposited on emitter contact layer 52.

(i) A photoresist layer (not shown) is spun on and the transistor emitter is defined. An emitter metal layer 56 of Ti/Pt/Au in thicknesses of, for example, 300/250/3000 Angstroms, respectively, is deposited and then lifted off, resulting in the structure of FIG. 9b.

(j) The emitter contact metal 56 is then used as a natural mask for the subsequent removal of WSi using $CF_4/O_2$ plasma reactive ion etching, which results in the structure of FIG. 9c.

(k) A solution of $H_2SO_4:H_2O_2:H_2O$ in the ratio 1:8:160 (by volume), for example, is then used to etch to base epilayer 46.

(l) A silicon nitride insulator layer 58 is then deposited to form the structure of FIG. 9d. This layer is then etched using Reactive Ion Etching, but because of the directionality of this technique, the insulator sidewalls 58 remain while all of the exposed insulator is removed, as shown in FIG. 9e.

(m) Photoresist (not shown) is again spun on and patterned to define the location of the base contacts 60 and emitter contact 62; this exposes emitter islands 48 and sidewalls 58 in addition to a portion of the base epilayer 46. Ti/Pt/Au metals are evaporated in sequence at thicknesses of, for example, 500, 250 and 1500 Angstroms, respectively, onto the photoresist and exposed areas. The overhanging sidewalls 58 shadow the part of the base epilayer 46 adjacent to emitter 48, so the evaporated metal does not contact emitter 48. The photoresist is then removed which lifts off the metal except the portion 60 which is on the base epilayer 46 and the portion 62 above emitter island 48 and sidewalls 58. The resulting structure is shown in FIG. 9f.

(n) Photoresist (not shown) is then deposited and patterned to define the connection to the subcollector layer 42. Layers 46, and 44 are then etched using a solution of $H_2SO_4:H_2O_2:H_2O$ in the ratio of 1:8:160 (by volume), for example. Afterwards, AuGe/Ni/Au metals are evaporated onto the wafer to thicknesses of, for example, 500/140/2000 Angstroms, respectively, to form the collector contacts 64. The photoresist layer is then stripped, which lifts off all excess metallization, and results in the structure shown in FIG. 9g. The remaining metal is then alloyed at 430° C. for 1 minute, for example.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transistor comprising a plurality of active regions arranged about a center point in a semiconductor substrate, each of said active regions adjacent one another and evenly spaced from said center point and comprising an elongate control structure having a length and a width, wherein said width of said control structure is progressively greater in said plurality for active regions further from said center point.

2. The transistor of claim 1 wherein said plurality of active regions comprises:
   a central active region comprising an emitter of a first width;
   a first pair of active regions, one member of said pair each on opposite sides of said central active region, and comprising an emitter of a second width;
   a second pair of active regions, one member of said pair each on opposite sides of said central active region and lying outside of said first pair, each member of said second pair comprising an emitter of a third width; wherein said third width is greater than said second and first widths, and said second width is greater than said first width.

3. The transistor of claim 2 wherein said emitter of said active regions comprises a layer of a first semiconductor material, and wherein said active regions further comprise base and collector layers of a second semiconductor material, said first semiconductor material having a wider bandgap than that of said second semiconductor material.

4. The transistor of claim 3 wherein said first semiconductor material is AlGaAs and said second semiconductor material is GaAs.

5. A transistor comprising a plurality of active regions arranged about a center point in a semiconductor substrate, each of said active regions adjacent one another and comprising an elongate control structure having a length and a width, wherein said length of said control structure is progressively greater in said plurality for active regions further from said center point.

6. The transistor of claim 5 wherein said plurality of active regions comprises:
   a central active region comprising an emitter of a first length;
   a first pair of active regions, one member of said pair each on opposite sides of said central active region, and comprising an emitter of a second length;
   a second pair of active regions, one member of said pair each on opposite sides of said central active region and lying outside of said first pair, each member of said second pair comprising an emitter of a third length; wherein said third length is greater than said second and first lengths, and said second length is greater than said first length.

7. The transistor of claim 6 wherein said emitter of said active regions comprises a layer of a first semiconductor material, and wherein said active regions further comprise base and collector layers of a second semiconductor material, said first semiconductor material having a wider bandgap than that of said second semiconductor material.

8. The transistor of claim 7 wherein said first semiconductor material is AlGaAs and said second semiconductor material is GaAs.

9. The transistor of claim 5 wherein said active regions are evenly spaced from said center point.

* * * * *